United States Patent
Reichenbach et al.

(10) Patent No.: US 6,955,975 B2
(45) Date of Patent: Oct. 18, 2005

(54) METHOD FOR JOINING A SILICON PLATE TO A SECOND PLATE

(75) Inventors: Frank Reichenbach, Reutlingen (DE); Frank Fischer, Gomaringen (DE); Ralf Hausner, Reutlingen (DE); Frieder Haag, Wannweil (DE); Eckhard Graf, Gomaringen (DE); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 11 days.

(21) Appl. No.: 10/433,525

(22) PCT Filed: Sep. 5, 2002

(86) PCT No.: PCT/DE02/03282

§ 371 (c)(1),
(2), (4) Date: Nov. 13, 2003

(87) PCT Pub. No.: WO03/032377

PCT Pub. Date: Apr. 17, 2003

(65) Prior Publication Data

US 2004/0082145 A1 Apr. 29, 2004

(30) Foreign Application Priority Data

Oct. 5, 2001 (DE) .......................... 101 49 140

(51) Int. Cl.[7] ........................ H01L 21/30; H01L 21/46
(52) U.S. Cl. ....................... 438/455; 438/456
(58) Field of Search ............................. 438/455, 456, 438/458–464, 975

(56) References Cited

U.S. PATENT DOCUMENTS 5,010,036 A 4/1991 Calviello et al.

FOREIGN PATENT DOCUMENTS

| DE | 28 49 716 | 5/1980 |
| DE | 195 04 967 | 8/1996 |
| GB | 2 244 374 | 11/1991 |
| GB | 2244374 | * 11/1991 |
| WO | WO 99/05719 | 2/1999 |

OTHER PUBLICATIONS

IBM Technical Disclosure Bulletin, NN 7907681, Jul. 1979.*
Henry, B.C. et al., "Semiconductor structure with infrared energy absorption layer", IBM Technical Disclosure Bulletin, IBM Corp., New York, US, vol. 22, No. 2, Jul. 1, 1979, p. 681*.

* cited by examiner

Primary Examiner—Asok Kumar Sarkar
(74) Attorney, Agent, or Firm—Kenyon & Kenyon

(57) ABSTRACT

A method for joining a silicon plate to a second plate, a laser beam being directed through the silicon plate at the second plate. In the process, the wavelength of the laser beam is selected in such a way that only a negligibly small amount of energy is absorbed in the silicon plate. A strongly absorbent material is hotmelted by the laser beam's energy and then produces a bond between the silicon plate and the second plate.

8 Claims, 2 Drawing Sheets

METHOD FOR JOINING A SILICON PLATE TO A SECOND PLATE

BACKGROUND INFORMATION

The present invention relates to a method for joining a silicon plate to a second plate. In conventional methods, a silicon plate is joined to a second plate by placing the silicon plate on the second plate. When the second plate is made of a specific glass, then, by increasing temperature and applying electric voltages, a bond can be produced between silicon plate 1 and the second plate 2. This process is called anodic bonding. In addition, silicon plates can be bonded to other plates using adhesive processes.

SUMMARY

An example method according to the present invention may have the advantage that by using a laser beam and by hotmelting a strongly absorbent material, especially small join regions may be formed between a silicon plate and a second plate. In this way, the space required for a connection of this kind may be kept to a minimum. In addition, the method makes it possible to select from a multiplicity of materials for the second plate, i.e., the silicon plate may be joined to a second plate which is selected from a multiplicity of materials.

In one embodiment, the strongly absorbent material may be formed from either a thin, superficial layer, or, the second plate may be completely made of this material. In this way, a multiplicity of materials may be used for the heavily absorbent material, and a multiplicity of materials for the second plate. The actual bonding may be carried out by using a plurality of bonding methods, such as adhesive bonding, soldering, positive-engagement connections, or welding (heat sealing). In particular, by using a thin, superficial absorption layer, it is also possible to bond the silicon plate directly to a second silicon plate, which is especially advantageous in terms of the thermal expansion coefficients. In particular, in this way, hermetically tight connections may be formed where a cavity is then hermetically sealed by a circumferential seam. Within the circumferential seam, a contacting may then be provided in the cavity. The method according to the present invention is especially suited for cases where a multiplicity of structures is produced simultaneously on the silicon plate or on the second plate. It is then advantageous, immediately after adjusting the two plates to one another, to fix this adjusted position by establishing a punctiform connection.

BRIEF DESCRIPTION OF THE DRAWINGS

Exemplary embodiments of the present invention are illustrated in the drawings and explained in detail in the following description. All of the figures show a cross section through the plate.

DETAILED DESCRIPTION

Figure 1:
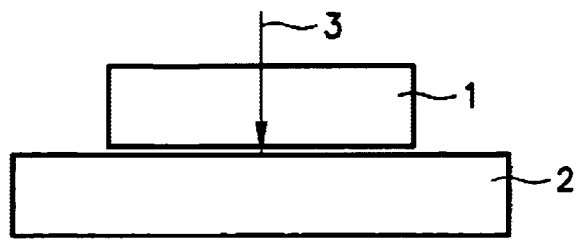
FIGS. 1 and 2 shows a first exemplary embodiment of the method according to the present invention.

FIG. 1 shows a silicon plate 1 which is placed on a second plate 2. A laser beam 3 is directed through silicon plate 1 at the surface of second plate 2. The wavelength of laser beam 3 is selected in such a way that only a negligibly small amount of energy is absorbed in silicon material 1. This is achieved in that the wavelength of the laser light is in the infrared range, since silicon is transparent in this frequency range. The material of second plate 2 is selected in such a way that an intense absorption already takes place in a thin, superficial layer. This intense absorption of the laser energy in a relatively thin layer results in an intense thermal warming of this layer, which leads to a hotmelting of this region. The hotmelted region enables a bond to be produced with silicon plate 1. In this context, various bonding mechanisms are possible. On the one hand, the hotmelted material of second silicon plate 2 may be bonded to the surface of silicon wafer 1. This occurs, for example, when second plate 2 is made of a plastic material which is hotmelted by the energy introduced by laser beam 3. A superficial bonding of such a plastic plate 2 to the surface of silicon wafer 1 then follows. In addition, a heat sealing may follow in such a way that both second plate 2, as well as silicon plate 1, are melted by the energy introduced by the laser beam. The energy absorbed in second plate 2 is also transferred by thermal conduction to silicon wafer 1. In this context, a hotmelting of both second plate 2, as well as of silicon wafer 1 occurs. In the process, the melted material of silicon plate 1 and of second plate 2 mix and form a blended melted mass which contains the material of both silicon plate 1 as well as of second plate 2. Following the cooling, this molten region then forms the welded connection between silicon plate 1 and second plate 2. In addition, a positive engagement may be produced, as explained further below with reference to FIGS. 3 and 4. There may also be a soldered connection between silicon plate 1 and second plate 2.

Figure 2:
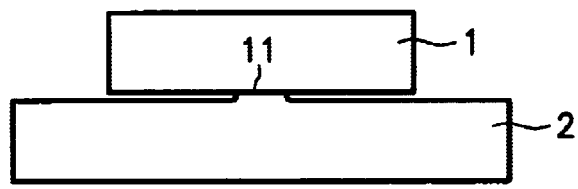

FIG. 2 depicts a bonding of silicon plate 1 to second plate 2 by way of a hotmelt-adhesive region 11. In this case, it is intended, in particular, to use a plastic material for second plate 2. By introducing the energy of laser beam 3, the plastic material of second plate 2 is hotmelted and, in the liquefied state, has wetted the surface of silicon wafer 1. Adhesive forces produce a bonding between silicon plate 1 and second plate 2.

Figure 3:
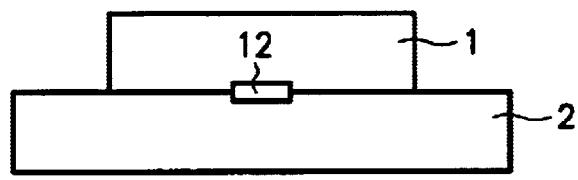
FIG. 3 shows another exemplary embodiment of the method according to the present invention.

As a further example, FIG. 3 shows the formation of the bonding region as welded region 12. Starting from FIG. 1, the energy introduced by laser beam 3 hotmelts both second plate 2, as well as the material of silicon plate 1. The blending of the two materials in the molten state and the solidification following the cooling produce welded region 12. For second plate 2, it is intended, in particular, to use ceramic material, glass or semiconductor materials (in particular silicon) or metal. The material of second plate 2 is designed, in turn, to strongly absorb the energy from laser beam 3. In the case of silicon, this may be achieved by superficial layers (not shown here in greater detail) or by introducing suitable dopants. In this context, it may be important that only a hotmelting of both the material of second plate 2, as well as of the material of silicon plate 1 occur, i.e., the two materials must be suitably adapted to one another in terms of their melting points. Moreover, the materials should be selected in a way that results in a thorough intermixing of the molten masses and a formation of a welded connection 12.

Figure 4:
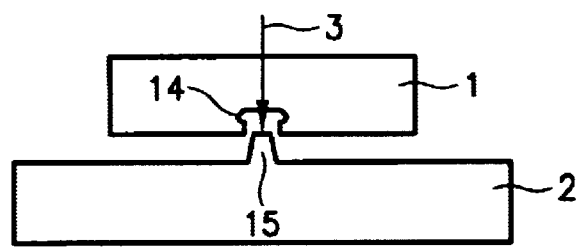
FIGS. 4 and 5 show another exemplary embodiment of the method according to the present invention.
Figure 5:
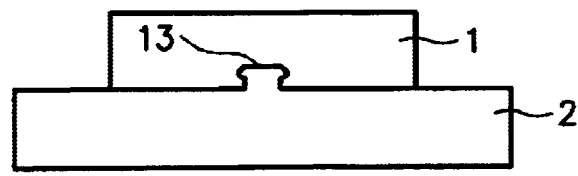

FIGS. 4 and 5 illustrate another method where the join region is formed by the energy introduced by laser beam 3 as a positive-engagement region 13 (FIG. 5). To form positive-engagement region 13, silicon plate 1 has a recess 14, and second plate 2 a lug 15. To produce the connection, recess 14 is placed on lug 15, and the material of lug 15 is heated by the energy of laser beam 3. The hotmelting of the material of lug 15 results in a deformation of the lug; in particular, the molten material of lug 15 completely fills the cavity of recess 14. Recess 14 is designed, in particular, to have an undercut; i.e., the diameter of recess 14 is greater depthwise than at the surface where silicon plate 1 faces second plate 2. Undercuts of this kind may be formed in silicon plate 1 by using etching processes. In this way, it is possible to produce a positive-engagement connection between a silicon plate 1 and a second plate 2.

Figure 6:
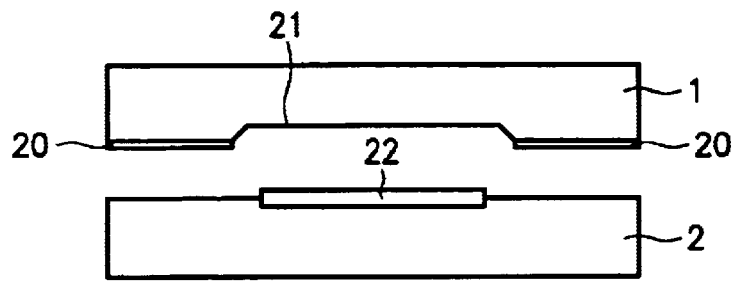
FIGS. 6, 7, and 8 show another exemplary embodiment of the method according to the present invention.
Figure 7:
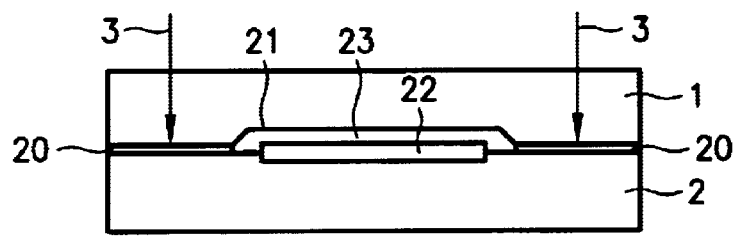
Figure 8:
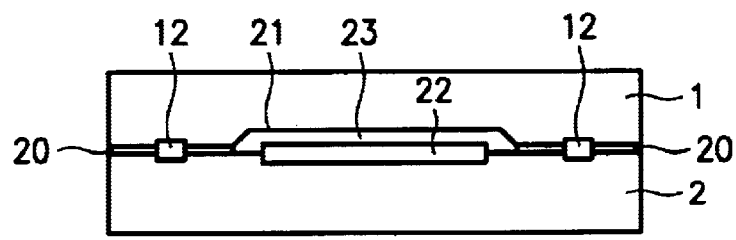

In the description of the previous figures, the assumption was made that second plate 2 is completely made of one and the same material which is strongly absorbent for the wavelength of laser beam 3. For practical applications, however, it completely suffices and may be advantageous in many cases when only a thin, superficial layer is made of a strongly absorbent material, and when this strongly absorbent layer is situated between silicon plate 1 and second plate 2. In this context, it is also unimportant whether the strongly absorbent layer is placed before the bonding on silicon plate 2 or second plate 1. FIGS. 6–8 show a bonding process of this kind.

In FIG. 6, a silicon plate 1 and a second plate 2 are shown in a pulled-apart state. On the side of silicon plate 1 that second plate 2 faces, an absorption layer 20 and a recess 21 are provided. A micromechanical structure 22 is situated on second plate 2, on the side that silicon plate 1 faces. As is apparent in FIG. 7, silicon plate 1 having absorption layer 20 is placed on second plate 2, and a laser beam is then directed through silicon plate 1 at absorption layer 20. In the process of placing one plate on the other, recess 21 is positioned over micromechanical structure 22. The dimensions of recess 21 are such that a cavity 23 remains above micromechanical structure 22. Laser beam 3 introduces energy into absorption layer 20, thereby intensely heating this absorption layer. In the process sequence of FIGS. 6, 7 and 8, the assumption is made that the introduced energy is so powerful that silicon plate 1 and second plate 2 are melted in those regions which are in close proximity to the point of incidence of laser beam 3 on absorption layer 20. The melted material of silicon plate 1, of absorption layer 20, and of second plate 2 mix in the molten state and, following laser irradiation and cooling, form a welded connection 12 between silicon plate 1 and second plate 2. This state is shown in cross-section in FIG. 8, this cross-section also illustrating a section through welded regions 12.

Various materials may be used for absorption layer 20. For example, for second plate 2, a glass plate or a silicon plate may be used, and absorption layer 20 may be made of plastic. By using a plastic layer of this kind, an adhesive bond would then form, as was already described with reference to FIG. 2. Absorption layer 20 may also be provided with one lug 15, and silicon plate 1 may also have recesses 14. Then, similarly to the manner already described with reference to FIGS. 4 and 5, a bond could form using a positive-engagement region 13. For this form as well, an absorption layer 20 may then be used, which is relatively thin in comparison to plates 1 and 2 and which is equipped with appropriate lugs 15.

The formation of a welded connection is described with reference to FIGS. 6–7. This method is applicable, for example, when second plate 2 is likewise made of a silicon wafer. For the absorbent layer, thin metal layers, for example of aluminum, aluminum-silicon copper, platinum, titanium, chromium or other refractory metals, may be used. In addition, germanium, silicon-germanium or highly doped polysilicon layers may be used for absorption layer 20. As other materials for absorption layer 20, oxides and nitrides, for example silicon oxide and silicon nitride, may be used as absorption layers. The absorption layer may be used in relatively small layer thicknesses, it being recommended, however, that the layer thickness correspond approximately to the penetration depth of the laser, i.e., the reciprocal value of the absorption coefficient. In this context, depending on the material used, typical layer thicknesses are on the order of more than 100 nanometers. The material for layers of this kind may be processed using conventional thin-film techniques, such as sputtering, vapor deposition, spin-on deposition, CVD (chemical vapor) deposition, epitaxy, and the like. In addition, absorption layers 20 may be structurally formed, i.e., they are placed only where weld connections 12 are to be produced later. To the extent that it is simpler in terms of process technology, and there is no need to fear that the layers will adversely affect any existing micromechanical structures 22, these layers may also be deposited over the entire surface.

Besides the bonds already described using adhesive bonding, positive engagement, and welding (heat sealing), the bond formed by absorption layer 20 may also be produced by soldering. In this context, absorption layer 20 is made of a material which, in the hotmelted state, produces a soldered connection between silicon plate 1 and second plate 2. This may be especially useful when second plate 2 is a metal plate.

Figure 9:
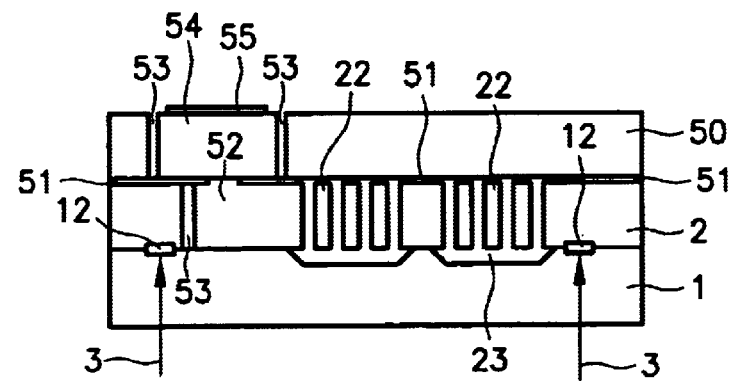
FIG. 9 shows yet another exemplary embodiment of the method according to the present invention.

FIGS. 6–8 show that a micromechanical structure 22 is placed in a cavity 23 which is formed by recess 21. A process of this kind has to do with the packaging of a micromechanical component, where micromechanical component 22 is packaged in a hermetically tight fashion in a cavity 23. In this context, welded connection 12 is formed as a circumferential seam, i.e., welded connection 12 completely surrounds micromechanical structure 22 in the plane formed by the two plates 1, 2. The problem arises then of how this micromechanical structure 22 is electrically contacted. In this regard, reference is made to FIG. 9 which depicts a cross-section through an exemplary micromechanical structure. In contrast to the previously described figures, here the silicon plate is positioned as the bottommost plate, and the laser beams are radiated from underneath, as shown by the arrows. Welded regions 12 are formed here by laser beams 3 and completely surround micromechanical structure 22. Micromechanical structures 22 are also shown merely schematically here. On the top side, micromechanical structures 22 are covered by another cover plate 50, which, by way of a spacer layer 51, are spaced apart from micromechanical structures 22. Micromechanical structures 22 are formed by introducing trenches into second plate 2 which split second plate 2 from top to bottom. Trench structures of this kind are able to be introduced quite simply into silicon plates, so that second plate 2 in this case is usually made of silicon. In an edge region, the micromechanical structures have a join region 52, which is separated by a trench structure 53 from the remaining material of silicon plate 2. In this join region 52, the material of silicon plate 2 directly bonds with the material of cover plate 50. For cover plate 50, one likewise envisages a silicon plate which is designed to be conductive, at least in some regions, by doping. Above join region 52, a contact region 54 is formed on which a contact metallization 55 is applied. Contact region 54, in turn, is electrically insulated by trenches 53 from the rest of silicon plate 50. By way of contact metallization 55 and subjacent contact region 54 or join region 52, micromechanical structures 22 located in cavity 23 may be electrically contacted. At the boundary surface between silicon plates 1, 2, no conductor track is able to be formed, namely, since a conductor track of this kind would be destroyed by circumferential welded connection 12. For that reason, it is necessary, within this circumferential seam, to provide an electrical feed-through lead via join region 52 or contact region 54 through which micromechanical structure 22 is contacted in cavity 23.

The method according to the present invention may be applied to silicon plates which have a multiplicity of structures. Since silicon plates are transparent to infrared light, by way of silicon plate 1, it is possible to align silicon plate 1 to second plate 2. A spot-type bonding of the two plates may be achieved using laser radiation, which effectively prevents the two plates from slipping relatively to one another in the further processing. The actual bonds may be subsequently formed. The processing duration, for example, may be longer than the time required to adjust the two plates 1, 2 relatively to one another, or to perform the spot bonding. This is of particular interest when a multiplicity of structures are formed in silicon plate 1 or in second plate 2 and when it is intended to produce connections over large regions. This is particularly the case when a multiplicity of individual structures are provided, which are each to be hermetically packaged, so that a circumferential connecting seam is required around each structure. This is the case, for example, when micromechanical structures are hermetically sealed, since each of these micromechanical structures 22 is surrounded by a complete connecting seam.

What is claimed is:

1. A method for joining a silicon plate to a second plate, comprising:

placing the silicon plate and the second plate one upon another;

directing a laser beam at the second plate through the silicon plate, a wavelength of the laser beam being selected so that only a small amount of energy is absorbed in the silicon plate;

providing strongly absorbent material on a surface of the silicon plate facing the second plate, the strongly absorbent material almost completely absorbing energy of the laser beam and being hotmelted by energy introduced by the laser beam;

cooling the hotmelted material and producing a bond between the silicon plate and the second plate;

providing a circumferential seam which completely surrounds an area of the surface of the silicon plate, the bond being formed using the circumferential seam;

providing an electrical feed-through lead within the circumferential seam in the silicon plate through which an electrical contact to an interior space is established which is situated between the silicon plate and the second plate.

2. The method as recited in claim 1, wherein the providing step includes situating a layer of the strongly absorbent material in an area of a bonding site between the silicon plate and the second plate.

3. The method as recited in claim 1, wherein the second plate is completely formed from the strongly absorbent material.

4. The method as recited in claim 1, wherein the second plate includes one of: silicon, metal, glass, plastic, metal, germanium or silicon germanium.

5. The method as recited in claim 1, wherein the strongly absorbent material includes one of: metal, germanium, silicon germanium, heavily doped polysilicon or a plastic.

6. The method as recited in claim 1, wherein the hotmelted, strongly absorbent material produces one of: a hotmelt-adhesive connection, a soldered connection, a positive-engagement connection, or a welded connection, between the silicon plate and the second plate.

7. The method as recited in claim 1, further comprising:

providing a plurality of structures on the silicon plate and the second plate; and adjusting the structures relative to one another, the adjustment being accomplished by directing infrared light through the silicon plate.

8. The method as recited in claim 7, further comprising:

after the adjusting step, forming spot-type connections between the silicon plate and the second plate through which an adjusted position of the silicon plate is retained relative to the second plate during the bond production.

* * * * *